United States Patent
Snowdon et al.

(10) Patent No.: US 7,719,324 B1
(45) Date of Patent: May 18, 2010

(54) LOW VOLTAGE DIFFERENTIAL SIGNAL (LVDS) TRANSMITTER WITH OUTPUT POWER CONTROL

(75) Inventors: Kenneth P. Snowdon, Falmouth, ME (US); Ivan Duzevik, Portland, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 218 days.

(21) Appl. No.: 12/098,230

(22) Filed: Apr. 4, 2008

(51) Int. Cl.
*H03B 1/00* (2006.01)
(52) U.S. Cl. .................. 327/108; 327/65; 327/112; 326/82; 326/83
(58) Field of Classification Search ............. 327/50–53, 327/65, 66, 108–112, 170, 379, 389, 391, 327/560, 563; 326/22–24, 26, 27, 30, 82, 326/83; 330/253, 258
See application file for complete search history.

(56) References Cited

U.S. PATENT DOCUMENTS 6,111,431 A * 8/2000 Estrada ..................... 326/83
6,452,422 B1 * 9/2002 Suzuki ...................... 326/83

* cited by examiner

*Primary Examiner*—Long Nguyen
(74) *Attorney, Agent, or Firm*—Vedder Price P.C.

(57) ABSTRACT

A low voltage differential signal (LVDS) transmitter with output power control. Internal sensing circuitry monitors output current flow through the termination impedance. When a proper termination impedance is not connected to the output, the resulting improper output current flow (e.g., zero output current when no termination impedance is connected) is detected by the sensing circuitry, which causes the supply current to the output driver circuitry to be reduced. Additionally, further in response to such detection of improper output current flow, the sensing circuitry can cause the output voltage to be limited, e.g., clamped, at a predetermined maximum magnitude.

21 Claims, 3 Drawing Sheets

LOW VOLTAGE DIFFERENTIAL SIGNAL (LVDS) TRANSMITTER WITH OUTPUT POWER CONTROL

BACKGROUND

1. Field of the Invention

The present invention relates to differential signal interfaces, and in particular, to low voltage differential signal (LVDS) transmitters for operating with reduced power dissipation.

2. Related Art

Differential input/output (I/O) signal interfaces are widely used for reliable high-speed data transfer in many forms of data communication channels. As is well known, differential signaling is preferred to single ended signaling due to its highly robust resistance to common mode noise associated with both conducted and radiated electromagnetic interference (EMI), as well as lower power dissipation compared to single ended static complementary metal oxide semiconductor (CMOS) implementations. Further, differential signaling generally also produces lower EMI emissions than their single ended counterparts due to reduced signal magnitudes and switching currents.

However, notwithstanding the ability to deliver reliable signals with lower power requirements, further improvements in reducing power consumption has become increasingly desirable for portable applications in which longer battery life and smaller physical size has become increasingly important.

SUMMARY

In accordance with the presently claimed invention, a low voltage differential signal (LVDS) transmitter with output power control. Internal sensing circuitry monitors output current flow through the termination impedance. When a proper termination impedance is not connected to the output, the resulting improper output current flow (e.g., zero output current when no termination impedance is connected) is detected by the sensing circuitry, which causes the supply current to the output driver circuitry to be reduced. Additionally, further in response to such detection of improper output current flow, the sensing circuitry can cause the output voltage to be limited, e.g., clamped, at a predetermined maximum magnitude.

In accordance with one embodiment of the presently claimed invention, a low voltage differential signal transmitter with output power control includes:

first and second power supply electrodes;

first and second input signal electrodes to convey a differential input signal;

first and second output signal electrodes to couple to a load impedance and convey a differential output signal corresponding to the differential input signal and including a signal voltage and a signal current;

current source circuitry coupled to the first power supply electrode and responsive to a current control signal by providing a supply current;

differential amplifier circuitry coupled to the current source circuitry, the second power supply electrode, the first and second input signal electrodes, and the first and second output signal electrodes, and responsive to the supply current and the differential input signal by providing the signal current and a sense voltage related to the signal current, wherein the signal current and the sense voltage have respective first magnitudes when the load impedance is coupled to the first and second output signal electrodes, and the signal current and the sense voltage have respective second magnitudes when the load impedance is not coupled to the first and second output signal electrodes; and voltage sensing circuitry coupled to the differential amplifier circuitry and the current source circuitry, and responsive to the sense voltage by providing the current control signal, wherein the supply current has higher and lower magnitudes when the sense voltage has the first and second magnitudes, respectively.

In accordance with another embodiment of the presently claimed invention, a low voltage differential signal transmitter with output power control includes:

current source means for receiving a current control signal and in response thereto providing a supply current;

differential amplifier means for receiving the supply current and a differential input signal and in response thereto providing a differential output signal, which includes a signal voltage and a signal current, and a sense voltage related to the signal current, wherein the signal current and the sense voltage have respective first magnitudes when the signal current is conducted via a load impedance, and the signal current and the sense voltage have respective second magnitudes when the signal current is not conducted via the load impedance; and voltage sensing means for receiving the sense voltage and in response thereto providing the current control signal, wherein the supply current has higher and lower magnitudes when the sense voltage has the first and second magnitudes, respectively.

In accordance with still another embodiment of the presently claimed invention, a method for transmitting a low voltage differential signal with output power control includes:

receiving a current control signal and in response thereto providing a supply current;

receiving the supply current and a differential input signal and in response thereto providing a differential output signal, which includes a signal voltage and a signal current, and a sense voltage related to the signal current, wherein the signal current and the sense voltage have respective first magnitudes when the signal current is conducted via a load impedance, and the signal current and the sense voltage have respective second magnitudes when the signal current is not conducted via the load impedance; and receiving the sense voltage and in response thereto providing the current control signal, wherein the supply current has higher and lower magnitudes when the sense voltage has the first and second magnitudes, respectively.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
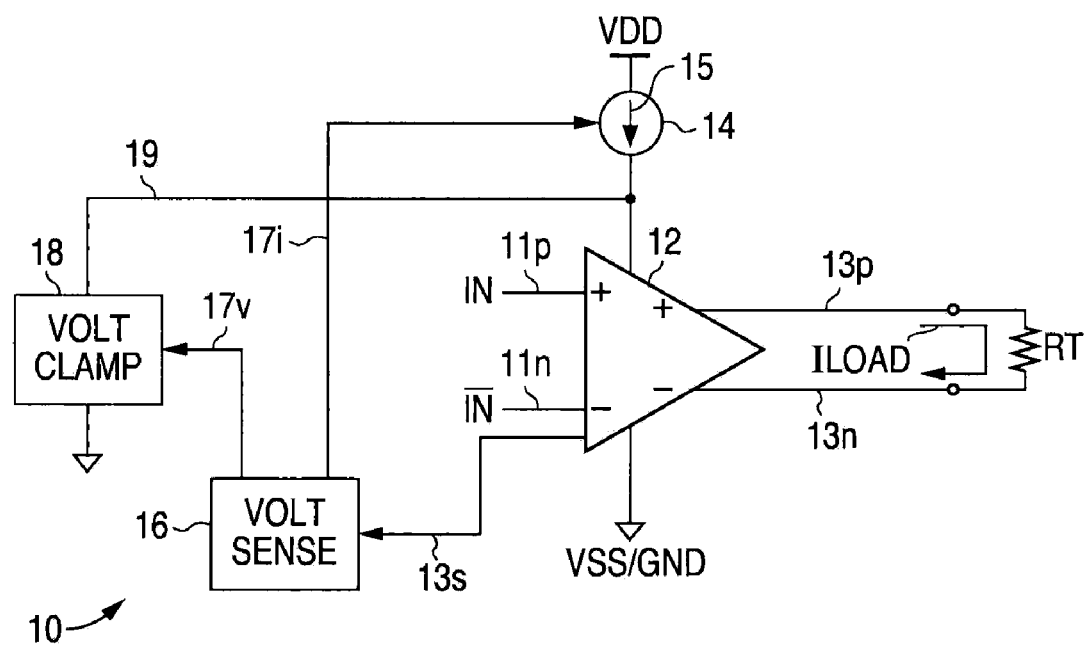
FIG. 1 is a block diagram of a LVDS signal transmitter with output power control in accordance with on embodiment of the presently claimed invention.

Referring to FIG. 1, a LVDS transmitter with output power control in accordance with one embodiment 10 of the presently claimed invention includes differential amplifier circuitry 12, controllable current source circuitry 14, voltage sensing circuitry 16 and voltage clamp circuitry 18, interconnected substantially as shown. In accordance with well known LVDS circuit operation, the positive 11$p$ and negative 11$n$ signal phases of the input signal 11 are buffered by the LVDS amplifier 12 to produce a differential output signal 13 having corresponding positive 13$p$ and negative 13$n$ signal phases which produce a load current ILOAD through a termination resistance RT. The supply current 15 for this current mode amplifier 12 is provided by the controllable current source 14 which is powered via the power supply voltage VDD.

As discussed in more detail below, an internal sense voltage 13$s$ is provided to the voltage sensing circuit 16. When this voltage 13$s$ drops below a predetermined value, the voltage sensing circuit 16 asserts a current control signal 17$i$ to cause the supply current 15 to be reduced by the controllable current source 14, and asserts a voltage control signal 17$v$ which causes the voltage clamping circuit 18 to clamp the circuit voltage 19 appearing at the input electrode via which the supply current 15 is provided.

During normal operation, the load current ILOAD is conducted via the termination resistance RT, thereby causing the sense voltage 13$s$ to remain above a predetermined voltage threshold. Accordingly, the current control 17$i$ and voltage control 17$v$ signals are de-asserted by the voltage sensing circuit 16. However, in the event that the load current ILOAD decreases below a predetermined amount, e.g., if the termination resistance becomes disconnected or otherwise increases significantly in resistance, this is reflected by a corresponding drop in the sense voltage 13$s$. When this sense voltage 13$s$ drops below the predetermined voltage threshold, the voltage sensing circuit asserts its current control signal 17$i$ and voltage control signal 17$v$, thereby causing the current source 14 to decrease the supply current 15 and the voltage clamp 18 to clamp the voltage 19 at the current supply electrode, respectively.

Figure 2A:
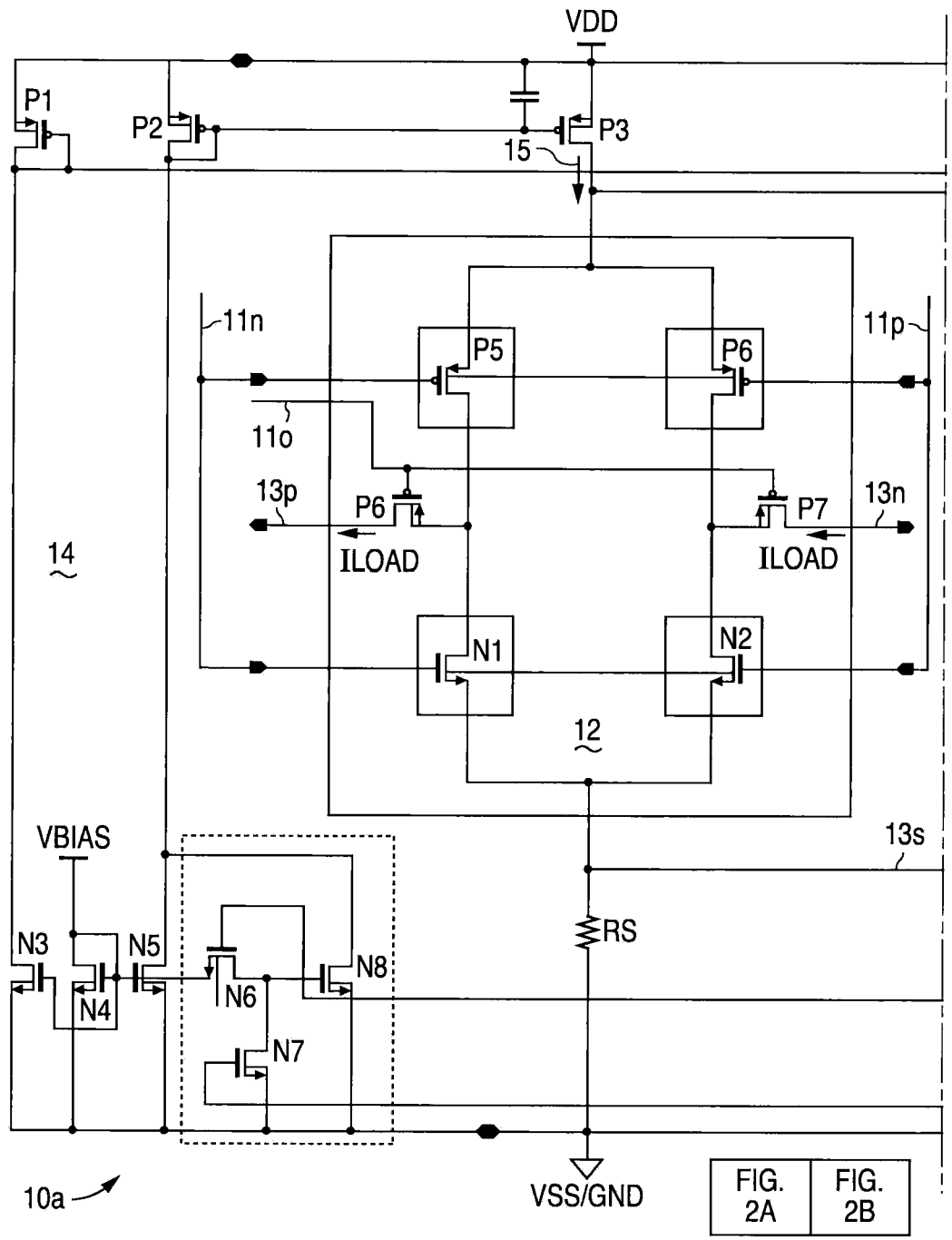
FIGS. 2A and 2B together are a schematic of one exemplary embodiment of the circuit of FIG. 1.
Figure 2B:
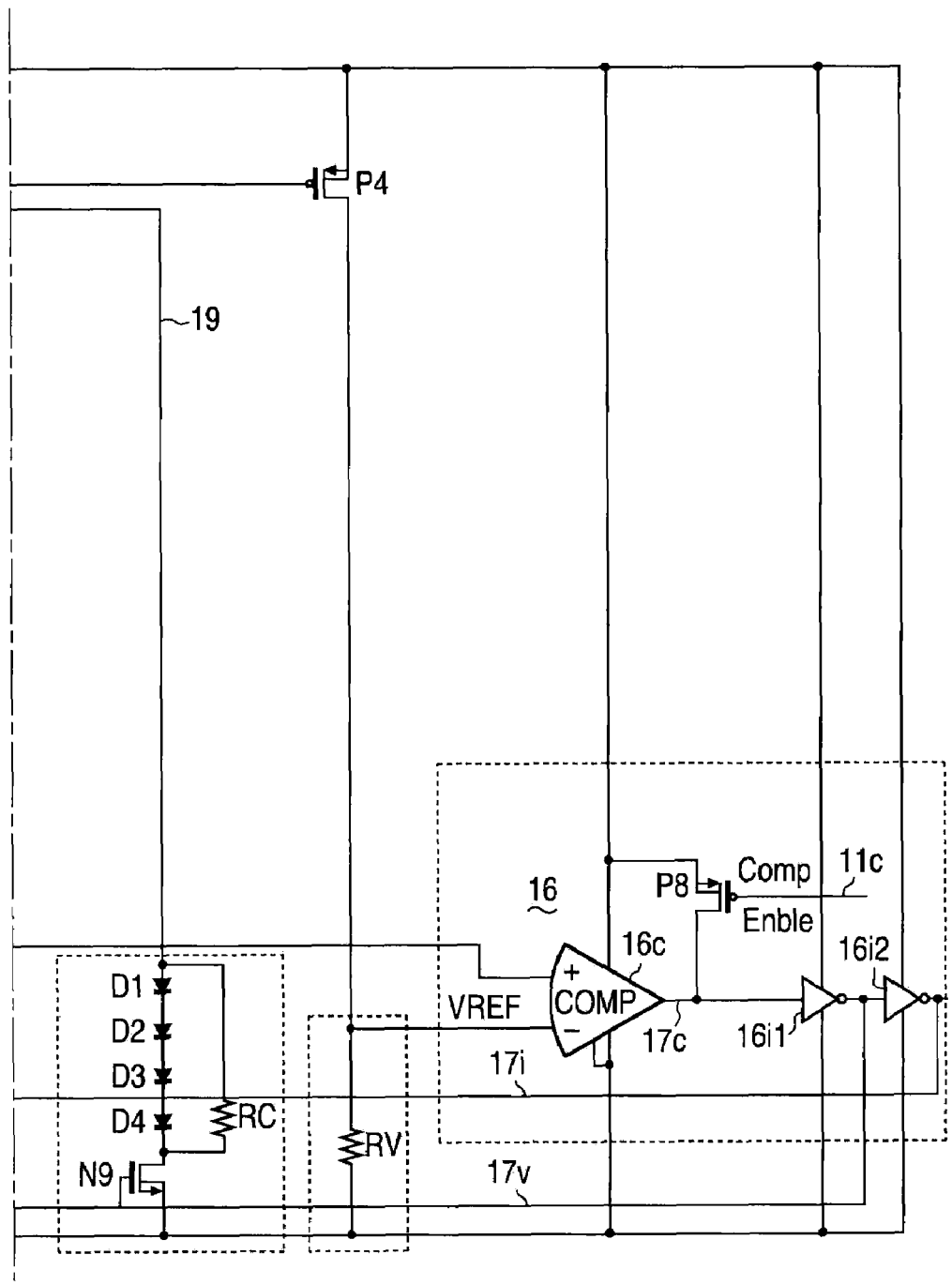

Referring to FIGS. 2A and 2B, one example embodiment 10$a$ of the circuit 10 of FIG. 1 can be implemented as shown. The differential amplifier circuitry 12 is formed by P-type metal oxide semiconductor field effect transistors (P-MOSFETs) P5, P6, N-type MOSFETs N1, N2, and a pedestal (or tail) resistance RS, interconnected substantially as shown. Additional P-MOSFETs P6, P7 are provided in series with the output signal phases 13$p$, 13$n$ for use as series switches for enabling and disabling the output signal in accordance with a control signal 110. The sense voltage 13$s$ is the voltage appearing across the pedestal resistance RS.

The current source 14 is formed with P-MOSFETs P1, P2, P3 and N-MOSFETs N3, N4, N5, N6, N7, N8, interconnected substantially as shown. The voltage sensing circuit 16 is implemented with a voltage comparator circuit 16$c$ a P-MOSFET P4, a resistance RV, and two binary signal inverters 16$i$1, 16$i$2, interconnected substantially as shown. An additional P-MOSFET P8 can be used, connected as shown, to allow the voltage sensing circuit 16 to be enabled and disabled in accordance with a control signal 11$c$.

The voltage clamping circuit 18 is implemented with a P-MOSFET N9, multiple (e.g., 4) diodes D1, D2, D3, D4, and a resistance RC, interconnected substantially as shown.

As noted above, normally a termination resistance RT (FIG. 1) is connected at the output electrodes to receive and conduct the load current ILOAD. In accordance with well known principles, this load current ILOAD, in accordance with the opposing states of the binary input signal phases 11$p$, 11$n$, also flows through transistors P5 and N2 in alternation with transistors P6 and N1. In all cases, however, the load current ILOAD, which is equal to the supply current 15, flows through the pedestal resistance RS, thereby producing the sense voltage 13$s$. Ideally, the pedestal resistance RS is chosen to have a value such that the common mode voltage of the input signal phases 13$p$, 13$n$ is approximately 1.7 volts. When the termination resistance RT becomes disconnected (or otherwise substantially increases in value) the current flow through the pedestal resistance RS decreases significantly, e.g., to zero. This causes a significantly reduced, e.g., zero, sense voltage 13$s$ across the pedestal resistance RS.

This sense voltage 13$s$ is compared by the voltage comparator 16$c$ with a reference voltage VREF, which is generated by a current flow through the resistance RV as provided by transistor P4. This transistor P4 is controlled by a bias voltage made available within the current source circuit 14 in this embodiment 10$a$. However, it will be readily appreciated that other sources of appropriate bias voltage can be provided. When the sense voltage 13$s$ drops below the reference voltage VREF, the output voltage 17$c$ of the voltage comparator 16$c$ also drops, e.g., to a logic zero value. This causes output signals 17$v$ and 17$i$ of logic inverters 16$i$1 and 16$i$2 to be asserted high and low, respectively.

During normal operation, i.e., when the termination resistance is connected and the load current ILOAD flows such that the sense voltage 13$s$ is higher than the reference voltage VREF, the output 17$c$ of the voltage comparator 16$c$ is at a logic high value, thereby causing signals 17$v$ and 17$i$ to be de-asserted at their low and high values, respectively. As a result, transistor N6 is turned on and transistors N7 and N9 are turned off. With transistors N6 and N7 turned on and off, respectively, transistors N5 and N8 are biased in their on states in parallel by the operation of transistors P1, N3 and N4. This causes the maximum amount of current to be drawn through transistor P2, which, as the input of a current mirror circuit, causes a proportional (e.g., equal) current to be provided as the supply current 15 via transistor P3. With transistor N9 turned off, no current flows through diodes D1, D2, D3, D4 and the voltage 19 is allowed to float in accordance with the voltage potential resulting from the normal supply current 15.

When the sense voltage 13s drops below the reference voltage VREF, as discussed above, control signals 17v and 17i are asserted high and low, respectively. As a result, transistor N6 is turned off and transistors N7 and N9 are turned on. With transistors N6 and N7 turned off and on, respectively, transistor N8 is turned off, thereby reducing the amount of current drawn through the input current mirror transistor P2. This results in a correspondingly reduced mirrored current being available as the supply current 15 via transistor P3. This reduces the potential power consumption of the differential amplifier circuit 12. With transistor N9 turned on, current flows through the diodes D1, D2, D3, D4, thereby causing the voltage 19 to be clamped at approximately 2.4 volts, thereby clamping the maximum possible output voltage appearing in the output signal phases 13p, 13n.

When a proper termination resistance RT is again connected to the output electrodes (e.g., when output switch transistors P6 and P7 have been turned from their off states to their on states), and load current ILOAD flows again, the sense voltage 13s across the pedestal resistance RS is detected by the voltage sensing circuit 16 such that control signals 17v and 17i are again de-asserted to their low and high signal states, respectively, thereby causing normal operation to resume.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a low voltage differential signal transmitter with output power control, comprising:
    first and second power supply electrodes;
    first and second input signal electrodes to convey a differential input signal;
    first and second output signal electrodes to couple to a load impedance and convey a differential output signal corresponding to said differential input signal and including a signal voltage and a signal current;
    current source circuitry coupled to said first power supply electrode and responsive to a current control signal by providing a supply current;
    differential amplifier circuitry coupled to said current source circuitry, said second power supply electrode, said first and second input signal electrodes, and said first and second output signal electrodes, and responsive to said supply current and said differential input signal by providing said signal current and a sense voltage related to said signal current, wherein
        said signal current and said sense voltage have respective first magnitudes when said load impedance is coupled to said first and second output signal electrodes, and
        said signal current and said sense voltage have respective second magnitudes when said load impedance is not coupled to said first and second output signal electrodes; and
    voltage sensing circuitry coupled to said differential amplifier circuitry and said current source circuitry, and responsive to said sense voltage by providing said current control signal, wherein said supply current has higher and lower magnitudes when said sense voltage has said first and second magnitudes, respectively.

2. The apparatus of claim 1, wherein said current source circuitry comprises:
    a current source circuit responsive to said current control signal by providing a control current; and
    a current mirror circuit coupled to said current source circuit and responsive to said control current by providing said supply current.

3. The apparatus of claim 1, wherein said differential amplifier circuitry comprises:
    a first circuit branch including a first plurality of transistors coupled in series to said current source circuitry and to said first output signal electrode;
    a second circuit branch including a second plurality of transistors coupled in series to said current source circuitry and to said second output signal electrode; and
    a tail impedance coupled to said second power supply electrode and said first and second pluralities of transistors.

4. The apparatus of claim 1, wherein said voltage sensing circuitry comprises voltage comparison circuitry responsive to a reference voltage and said sense voltage by providing said current control signal.

5. The apparatus of claim 1, further comprising voltage clamping circuitry coupled to said differential amplifier circuitry and responsive to a voltage control signal by clamping said signal voltage, wherein:
    said voltage sensing circuitry is further coupled to said voltage clamping circuitry and further responsive to said sense voltage by providing said voltage control signal; and
    said voltage clamping circuitry clamps said signal voltage to a predetermined magnitude when said sense voltage has said second magnitude.

6. The apparatus of claim 5, wherein said current source circuitry comprises:
    a current source circuit responsive to said current control signal by providing a control current; and
    a current mirror circuit coupled to said current source circuit and responsive to said control current by providing said supply current.

7. The apparatus of claim 5, wherein said differential amplifier circuitry comprises a differential voltage mode amplifier circuit.

8. The apparatus of claim 5, wherein said differential amplifier circuitry comprises:
    a first circuit branch including a first plurality of transistors coupled in series to said current source circuitry and to said first output signal electrode;
    a second circuit branch including a second plurality of transistors coupled in series to said current source circuitry and to said second output signal electrode; and
    a tail impedance coupled to said second power supply electrode and said first and second pluralities of transistors.

9. The apparatus of claim 5, wherein said voltage sensing circuitry comprises voltage comparison circuitry responsive to a reference voltage and said sense voltage by providing said current control signal and said voltage control signal.

10. The apparatus of claim 5, wherein said voltage clamping circuitry comprises:
    a plurality of diodes mutually coupled in series; and
    switch circuitry serially coupled with said plurality of diodes between said differential amplifier circuitry and one of said first and second power supply electrodes, and responsive to said voltage control signal by allowing at least a portion of said supply current to flow via said plurality of diodes.

11. The apparatus of claim 1, further comprising voltage limiting circuitry coupled to said differential amplifier circuitry and responsive to a voltage control signal by limiting said signal voltage, wherein:
   said voltage sensing circuitry is further coupled to said voltage limiting circuitry and further responsive to said sense voltage by providing said voltage control signal; and
   said voltage limiting circuitry limits said signal voltage to a predetermined maximum magnitude when said sense voltage has said second magnitude.

12. The apparatus of claim 11, wherein said current source circuitry comprises:
   a current source circuit responsive to said current control signal by providing a control current; and
   a current mirror circuit coupled to said current source circuit and responsive to said control current by providing said supply current.

13. The apparatus of claim 11, wherein said differential amplifier circuitry comprises:
   a first circuit branch including a first plurality of transistors coupled in series to said current source circuitry and to said first output signal electrode;
   a second circuit branch including a second plurality of transistors coupled in series to said current source circuitry and to said second output signal electrode; and
   a tail impedance coupled to said second power supply electrode and said first and second pluralities of transistors.

14. The apparatus of claim 11, wherein said voltage sensing circuitry comprises voltage comparison circuitry responsive to a reference voltage and said sense voltage by providing said current control signal and said voltage control signal.

15. The apparatus of claim 11, wherein said voltage limiting circuitry comprises:
   a plurality of diodes mutually coupled in series; and
   switch circuitry serially coupled with said plurality of diodes between said differential amplifier circuitry and one of said first and second power supply electrodes, and responsive to said voltage control signal by allowing at least a portion of said supply current to flow via said plurality of diodes.

16. An apparatus including a low voltage differential signal transmitter with output power control, comprising:
   current source means for receiving a current control signal and in response thereto providing a supply current;
   differential amplifier means for receiving said supply current and a differential input signal and in response thereto providing a differential output signal, which includes a signal voltage and a signal current, and a sense voltage related to said signal current, wherein
      said signal current and said sense voltage have respective first magnitudes when said signal current is conducted via a load impedance, and
      said signal current and said sense voltage have respective second magnitudes when said signal current is not conducted via said load impedance; and
   voltage sensing means for receiving said sense voltage and in response thereto providing said current control signal, wherein said supply current has higher and lower magnitudes when said sense voltage has said first and second magnitudes, respectively.

17. The apparatus of claim 16, further comprising voltage clamping means for receiving a voltage control signal and in response thereto clamping said signal voltage, wherein:
   said voltage sensing means is further for receiving said sense voltage and in further response thereto providing said voltage control signal; and
   said voltage clamping means is for clamping said signal voltage to a predetermined magnitude when said sense voltage has said second magnitude.

18. The apparatus of claim 16, further comprising voltage limiting means for receiving a voltage control signal and in response thereto limiting said signal voltage, wherein:
   said voltage sensing means is further for receiving said sense voltage and in further response thereto providing said voltage control signal; and
   said voltage limiting means is for limiting said signal voltage to a predetermined maximum magnitude when said sense voltage has said second magnitude.

19. A method for transmitting a low voltage differential signal with output power control, comprising:
   receiving a current control signal and in response thereto providing a supply current;
   receiving said supply current and a differential input signal and in response thereto providing a differential output signal, which includes a signal voltage and a signal current, and a sense voltage related to said signal current, wherein
      said signal current and said sense voltage have respective first magnitudes when said signal current is conducted via a load impedance, and
      said signal current and said sense voltage have respective second magnitudes when said signal current is not conducted via said load impedance; and
   receiving said sense voltage and in response thereto providing said current control signal, wherein said supply current has higher and lower magnitudes when said sense voltage has said first and second magnitudes, respectively.

20. The method of claim 19, further comprising:
   receiving said sense voltage and in further response thereto providing a voltage control signal; and
   receiving said voltage control signal and in response thereto clamping said signal voltage to a predetermined magnitude when said sense voltage has said second magnitude.

21. The apparatus of claim 19, further comprising:
   receiving said sense voltage and in further response thereto providing a voltage control signal; and
   receiving said voltage control signal and in response thereto limiting said signal voltage to a predetermined maximum magnitude when said sense voltage has said second magnitude.

* * * * *